(12) United States Patent
Hilgers et al.

(10) Patent No.: US 11,195,985 B2
(45) Date of Patent: Dec. 7, 2021

(54) ELECTROACTIVE POLYMER ACTUATOR DEVICE AND DRIVING METHOD

(71) Applicant: KONINKLIJKE PHILIPS N.V., Eindhoven (NL)

(72) Inventors: Achim Hilgers, Alsdorf (DE); Daan Anton Van Den Ende, Breda (NL); Mark Thomas Johnson, Arendonk (BE); Roland Alexander Van De Molengraaf, Geldrop (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 526 days.

(21) Appl. No.: 16/306,691

(22) PCT Filed: Jun. 12, 2017

(86) PCT No.: PCT/EP2017/064246
§ 371 (c)(1),
(2) Date: Dec. 3, 2018

(87) PCT Pub. No.: WO2017/216086
PCT Pub. Date: Dec. 21, 2017

(65) Prior Publication Data
US 2019/0123258 A1   Apr. 25, 2019

(30) Foreign Application Priority Data
Jun. 14, 2016  (EP) .................................... 16174294

(51) Int. Cl.
*H01L 41/107* (2006.01)
*H01L 27/20* (2006.01)
(Continued)

(52) U.S. Cl.
CPC ............ *H01L 41/107* (2013.01); *C08L 27/16* (2013.01); *H01L 27/20* (2013.01);
(Continued)

(58) Field of Classification Search
CPC . H01L 41/107; H01L 41/0474; H01L 41/083; H01L 27/20
See application file for complete search history.

(56) References Cited

U.S. PATENT DOCUMENTS 5,962,954 A    10/1999  Leers et al.
6,172,447 B1    1/2001  Ishikawa et al.
(Continued)

FOREIGN PATENT DOCUMENTS

DE   102014005851 A1   10/2015
EP       2654194 A1   10/2013
(Continued)

OTHER PUBLICATIONS

Carpi et al. "Biomedical Applications of EAPs" p. 327 John Wiley & Sons Ltd., Published Apr. 17, 2009.
(Continued)

*Primary Examiner* — Bryan P Gordon
(74) *Attorney, Agent, or Firm* — Schott, P.C.

(57) ABSTRACT

An actuator device has an electroactive polymer actuator and an integrated piezoelectric transformer. At least a secondary side of the integrated piezoelectric transformer shares a piezoelectric electroactive polymer layer with the electroactive polymer actuator, so that lower external voltages can be applied to the actuator device. A diode is connected between the secondary side of the integrated piezoelectric transformer and the electroactive polymer actuator.

20 Claims, 3 Drawing Sheets

(51) Int. Cl.
*C08L 27/16* (2006.01)
*H01L 41/047* (2006.01)
*H01L 41/083* (2006.01)
*H01L 41/193* (2006.01)

(52) U.S. Cl.
CPC ........ *H01L 41/0474* (2013.01); *H01L 41/083* (2013.01); *H01L 41/193* (2013.01)

(56) References Cited

U.S. PATENT DOCUMENTS

| | | | |
|---|---|---|---|
| 6,707,235 | B1 | 3/2004 | Breboel |
| 2001/0017506 | A1 | 8/2001 | Ettes et al. |
| 2002/0008445 | A1 | 1/2002 | Pelrine et al. |
| 2002/0011764 | A1* | 1/2002 | Nakatsuka ............ H01L 41/044 310/359 |
| 2003/0102774 | A1 | 6/2003 | Carazo et al. |
| 2005/0030774 | A1 | 2/2005 | Vazquez |
| 2007/0216735 | A1 | 9/2007 | Kobayashi et al. |
| 2009/0218916 | A1* | 9/2009 | Florian ................. H01L 41/107 310/366 |
| 2012/0299514 | A1 | 11/2012 | Anderson et al. |
| 2013/0176608 | A1* | 7/2013 | Brokken ................ G02B 26/08 359/224.1 |
| 2014/0036546 | A1* | 2/2014 | Minobe ............ H02M 3/33507 363/21.02 |
| 2014/0167571 | A1 | 6/2014 | Meyer |

FOREIGN PATENT DOCUMENTS

| | | |
|---|---|---|
| JP | H05-129672 A | 5/1993 |
| RU | 2568944 C2 | 11/2015 |
| WO | 200106579 A2 | 1/2001 |

OTHER PUBLICATIONS

Anderson et al. "Low Voltage Driven Dielectric Electro Active Polymer Actuator with Integrated Piezoelectric Transformer based Driver" Electroactive Polymer Actuators and Devices, Mar. 7-10, 2011, Proceedings of SPIE, vol. 7976.

Vucheva et al. "Investigation of MEMS Piezoelectric Transformer with PVDF Thin Layer" Materials Science Forum, vol. 859, May 19, 2016 p. 356-261.

* cited by examiner

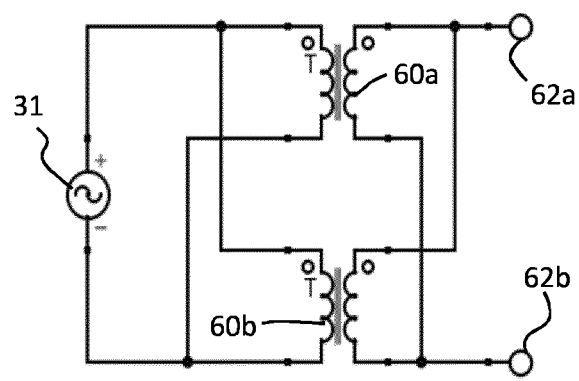
FIG. 6A
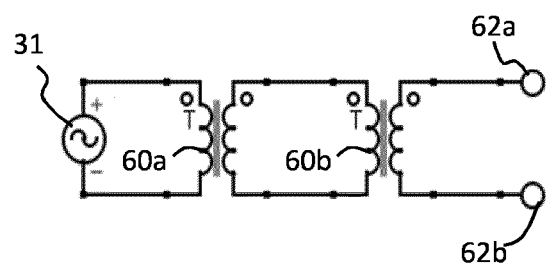
FIG. 6B
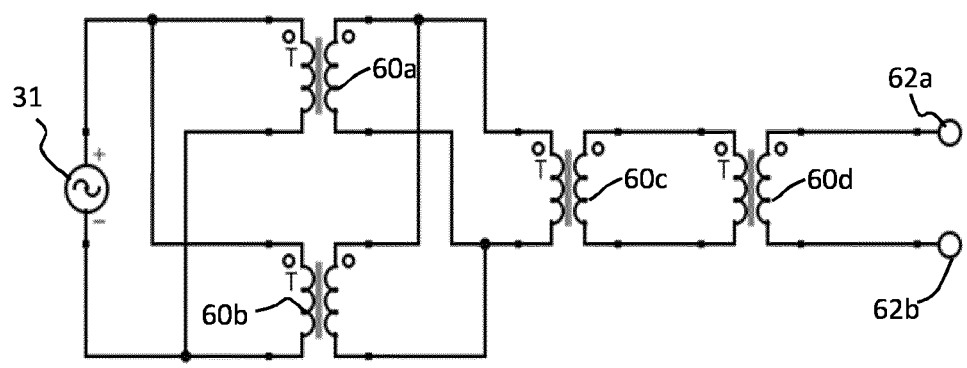
FIG. 6C
FIG. 6

ELECTROACTIVE POLYMER ACTUATOR DEVICE AND DRIVING METHOD

CROSS-REFERENCE TO PRIOR APPLICATIONS

This application is the U.S. National Phase application under 35 U.S.C. § 371 of International Application No. PCT/EP2017/064246, filed on Jun. 12, 2017, which claims the benefit of EP Patent Application No. EP 16174294.5, filed on Jun. 14, 2016. These applications are hereby incorporated by reference herein.

FIELD OF THE INVENTION

This invention relates to electroactive polymer actuators.

BACKGROUND OF THE INVENTION

Electroactive polymers (EAPs) are an emerging class of materials within the field of electrically responsive materials. EAPs can work as sensors or actuators and can easily be manufactured into various shapes allowing easy integration into a large variety of systems.

Materials have been developed with characteristics such as actuation stress and strain which have improved significantly over the last ten years. Technology risks have been reduced to acceptable levels for product development so that EAPs are commercially and technically becoming of increasing interest. Advantages of EAPs include low power, small form factor, flexibility, noiseless operation, accuracy, the possibility of high resolution, fast response times, and cyclic actuation.

The improved performance and particular advantages of EAP materials give rise to applicability to new applications.

An EAP device can be used in any application in which a small amount of movement of a component or feature is desired, based on electric actuation. Similarly, the technology can be used for sensing small movements. This invention relates in particular to actuators.

The use of EAPs in actuator devices enables functions which were not possible before, or offers a big advantage over common actuator solutions, due to the combination of a relatively large deformation and force in a small volume or thin form factor, compared to common actuators. EAPs actuators also give noiseless operation, accurate electronic control, fast response, and a large range of possible actuation frequencies, such as 0-1 MHz, most typically below 20 kHz.

Devices using electroactive polymers can be subdivided into field-driven and ionic-driven materials.

Examples of field-driven EAPs include Piezoelectric polymers, Electrostrictive polymers (such as PVDF based relaxor polymers) and Dielectric Elastomers. Other examples include Electrostrictive Graft polymers, Electrostrictive paper, Electrets, Electroviscoelastic Elastomers and Liquid Crystal Elastomers.

Examples of ionic-driven EAPs are conjugated/conducting polymers, Ionic Polymer Metal Composites (IPMC) and carbon nanotubes (CNTs). Other examples include ionic polymer gels.

This invention relates in particular to actuator devices which incorporate a field-driven EAP material. These devices are actuated by an electric field through direct electromechanical coupling. They require high fields (volts per meter) but low currents due to their capacitive nature. Polymer layers are usually thin to keep the driving voltage as low as possible.

A first notable subclass of field driven EAPs are Piezoelectric and Electrostrictive polymers. While the electromechanical performance of traditional piezoelectric polymers is limited, a breakthrough in improving this performance has led to PVDF relaxor polymers, which show spontaneous electric polarization (field driven alignment). These materials can be pre-strained for improved performance in the strained direction (pre-strain leads to better molecular alignment). Normally, metal electrodes are used since strains usually are in the moderate regime (1-5%). Other types of electrodes (such as conducting polymers, carbon black based oils, gels or elastomers, etc.) can also be used. The electrodes can be continuous, or segmented.

Another subclass of interest of field-driven EAPs is that of Dielectric Elastomers. A thin film of this material may be sandwiched between compliant electrodes, forming a parallel plate capacitor. In the case of dielectric elastomers, the Maxwell stress induced by the applied electric field results in a stress on the film, causing it to contract in thickness and expand in area. Strain performance is typically enlarged by pre-straining the elastomer (requiring a frame to hold the pre-strain). Strains can be considerable (10-300%). This also constrains the type of electrodes that can be used: for low and moderate strains, metal electrodes and conducting polymer electrodes can be considered, for the high-strain regime, carbon black based oils, gels or elastomers are typically used. The electrodes can be continuous, or segmented.

FIGS. 1 and 2 show two possible operating modes for an EAP device.

The device comprises an electroactive polymer layer 14 sandwiched between electrodes 10, 12 on opposite sides of the electroactive polymer layer 14.

FIG. 1 shows a device which is not clamped. A voltage is used to cause the electroactive polymer layer to expand in all directions as shown.

FIG. 2 shows a device which is designed so that the expansion arises only in one direction. The device is supported by a carrier layer 16. A voltage is used to cause the electroactive polymer layer to curve or bow.

The nature of this movement for example arises from the interaction between the active layer which expands when actuated, and the passive carrier layer. To obtain the asymmetric curving around an axis as shown, molecular orientation (film stretching) may for example be applied, forcing the movement in one direction.

The expansion in one direction may result from the asymmetry in the EAP polymer, or it may result from asymmetry in the properties of the carrier layer, or a combination of both.

US 2007/216735 discloses an ink-jet head which uses a piezoelectric actuator to eject ink. A piezoelectric transformer is integrated with the actuator.

SUMMARY OF THE INVENTION

A problem with field driven electroactive polymers is the rather high operation voltages that are required, as mentioned above, to achieve high electric field strengths in the devices to realize desired deflections. Electronic driving circuits are used to generate these high voltages. Driving voltage amplitudes of up to 1 kV are required for these EAPs, so that high voltage devices need to be used and implemented, increasing the cost (and size) of the electronics enormously. The driving electronics and the EAP actuator are generally locally separated from each other resulting in the usage of high voltage feed-wires between the driver and the actuator. This however may be a safety issue for example in the case of broken wires and also results in high, unwanted (or even not-allowed) electric and magnetic fields as well as electromagnetic radiation, which may cause compliance certification issues or even could harm users.

There is therefore a need for an EAP actuator design which addresses these issues.

It is an object of the invention to fulfil this need at least partially. The invention is defined by the independent claims and the dependent claims provide advantageous embodiments.

Examples in accordance with an aspect of the invention provide an actuator device comprising:

an electroactive polymer actuator; and a piezoelectric transformer having a primary side and a secondary side, wherein the actuator device comprises a piezoelectric electroactive polymer layer comprising a first portion and a second portion, wherein the first portion of the electroactive polymer layer forms part of the secondary side of the piezoelectric transformer and the second portion of the electroactive polymer layer forms part of the electroactive polymer actuator.

In this actuator device, a part of an EAP actuator, which does not form part of the actuation (output) portion of the device, is used to form at least part of a piezoelectric transformer. In this way, the required high voltage drive signal may be generated locally using an integrated high voltage transformer. This has cost advantages, avoids the need for high voltage feed wires and also relaxes the electromagnetic radiation effects.

A diode arrangement is electrically connected between the secondary side of the piezoelectric transformer and the electroactive polymer actuator. This functions as an integrated rectifier, and may also be used to provide protection for high voltage amplitudes with an undesired polarity.

In one set of examples, the first portion of the piezoelectric electroactive polymer layer also forms part of the primary side of the piezoelectric transformer. In this way, a shared EAP layer is used in the primary transformer side, secondary transfer side and actuator parts of the overall device. This provides a low cost solution with maximum integration.

The first portion of the piezoelectric electroactive polymer layer may have a first molecular orientation at the primary side and a second, different, molecular orientation at the secondary side. In this way, although a shared layer is used, the properties may be tailored to achieve improved performance of the transformer.

For example, the first molecular orientation may be in a longitudinal direction extending between the piezoelectric transformer and the electroactive polymer actuator, and the second molecular orientation may be perpendicular to the plane of the piezoelectric electroactive polymer layer (i.e. vertical).

In another set of examples, the primary side and secondary side of the piezoelectric transformer are formed from different electroactive polymer materials. There is still a shared layer between the secondary side and the actuator. However, the transformer performance may be improved by using different materials at the primary side and the secondary side. The primary side provides electrical to mechanical conversion, and the secondary side provides mechanical to electrical conversion. In this device, different EAP technology types may be used.

The electroactive polymer material of the primary side of the piezoelectric transformer for example comprises a pre-strained dielectric elastomer.

In all examples, the primary side of the piezoelectric transformer may comprise a multilayer stack. This enables a desired transformer ratio to be obtained. The electroactive polymer actuator may also be formed as a multilayer stack.

An isolation region may be provided in the piezoelectric electroactive polymer layer between the secondary side of the piezoelectric transformer and the electroactive polymer actuator. This may be used to provide mechanical decoupling between the transformer and the actuator. In particular, the damping of the transformer function by the actuator operation may be reduced.

The isolation region may comprise one or more openings in the piezoelectric electroactive polymer layer and/or in additional interface material.

The piezoelectric transformer may comprise a set of coplanar transformer elements. In this way, each transformer element may have a desired ratio of thickness to linear dimension (in the plane of the layer). In particular, if a low thickness is desired for miniaturization purposes, the use of multiple (smaller area) coplanar transformer elements maintains a desired ratio of thickness to in-plane size. This helps maintain a high efficiency of the transformer.

The transformer elements may be electrically connected in parallel, with their inputs in parallel and their outputs in parallel, or in series, or as a combination of parallel and series transformer elements.

The piezoelectric transformer may be flexible. The piezoelectric electroactive polymer layer for example comprises polyvinylidene fluoride (PVDF) or polyvinylidene fluoride-trifluoroethylene (PVDF-TrFE).

Examples in accordance with another aspect of the invention provide a method of driving an electroactive polymer actuator, comprising:

applying a drive signal to a piezoelectric transformer having a primary side and a secondary side;

coupling the secondary side of the piezoelectric transformer to the electroactive polymer actuator using a common a piezoelectric electroactive polymer layer, such that a first portion of the electroactive polymer layer forms part of the secondary side of the piezoelectric transformer and a second portion of the electroactive polymer layer forms part of the electroactive polymer actuator;

coupling a diode arrangement between the secondary side (34) of the piezoelectric transformer and the electroactive polymer actuator (35); and driving the electroactive polymer actuator using the output from the piezoelectric transformer.

BRIEF DESCRIPTION OF THE DRAWINGS

Examples of the invention will now be described in detail with reference to the accompanying drawings, in which:

FIG. 6 shows three possible transformer circuits.

DETAILED DESCRIPTION OF THE EMBODIMENTS

Figure 1:
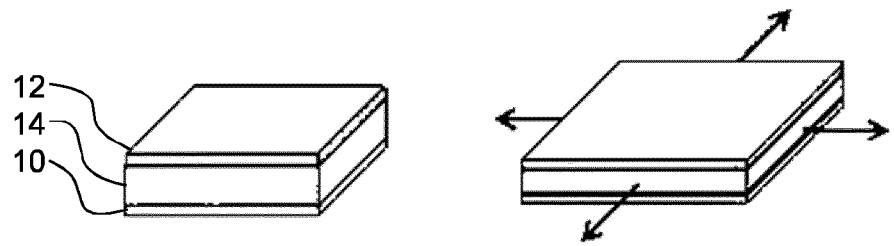
FIG. 1 shows a known electroactive polymer device which is not clamped.
Figure 2:
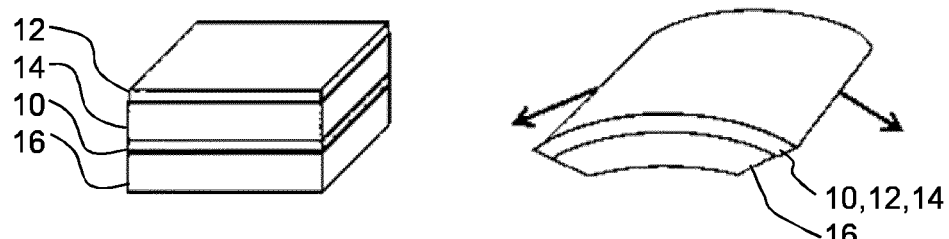
FIG. 2 shows a known electroactive polymer device which is constrained by a backing layer.

The invention provides an actuator device which has an electroactive polymer actuator and an integrated piezoelectric transformer. At least the secondary side of the transformer shares a piezoelectric electroactive polymer layer with the electroactive polymer actuator. This provides a device with an integrated transformer so that lower external voltages can be applied to the device.

In general terms, field driven electroactive polymer (EAP) actuators consist of an electrically isolating material, embedded between two electrically conducting electrodes. As a function of an applied voltage, the electric field between the electrodes causes a mechanical deformation of the EAP. As explained above, by using additional materials with a different extension coefficient (e.g. stiffness) to the EAP layer, the mechanical deformation can be directed in certain directions. By implementing multilayer technology, the field strength between the electrodes can be increased and hence lower voltage amplitudes are required to operate the EAP actuator, or higher mechanical deformations can be realized. This basic configuration is very similar to an electric multilayer capacitor.

A piezoelectric transformer (also known as a dielectric transformer) is another known passive device which can make use of both multilayer and monolayer technologies. Depending on the configuration, very high voltages can be generated, for example in the range of several kilovolts at very high efficiencies, for example more than 90%. Such transformers may be formed as flat devices for use in flat applications, where not enough space is available for conventional magnetic transformers.

A drawback of known piezoelectric transformers is their stiffness and brittleness caused by the typically used ceramic material. They are typically embedded in flexible (e.g. silicone) holders for this reason. In addition to a mechanical protection function, this soft and flexible embedded design enables the transformer to vibrate mechanically. This reduces mechanical damping, which would decrease the efficiency. The applied electrical field at the primary side (based on an applied input voltage) causes the primary side to deform. The primary and secondary parts are mechanically connected as a single integrated device, so the mechanical primary deformation is coupled to the secondary side of the device. The mechanical deformation generates an electrical field again, causing a voltage drop over a connected load.

From an operational point of view, different device vibration modes can be considered. Most common are transversal, longitudinal, thickness, planar, or radial modes as well as combination thereof. Most commonly, Rosen-type transformers use a combination of transversal and longitudinal vibration modes. Devices are also known which rely on thickness and radial vibration modes.

The voltage transformation ratio from the primary side to the secondary side basically depends on the form factor, the length (l) and the height (d) (i.e. thickness) of the component as well as the number of internal layers of the primary side (n) and secondary side. The performance depends on several material and design parameters as will be known to people skilled in the art. Further, from an electrical point of view, the output voltage also shows a dependency on the frequency of operation ($\omega=2\pi f$) and the load conditions.

The invention makes use of a piezoelectric EAP layer to form at least part of the electromechanical conversion layer of the transformer. The same layer then forms at least part of the transformer (the secondary side) as well as the EAP actuator.

Figure 3:
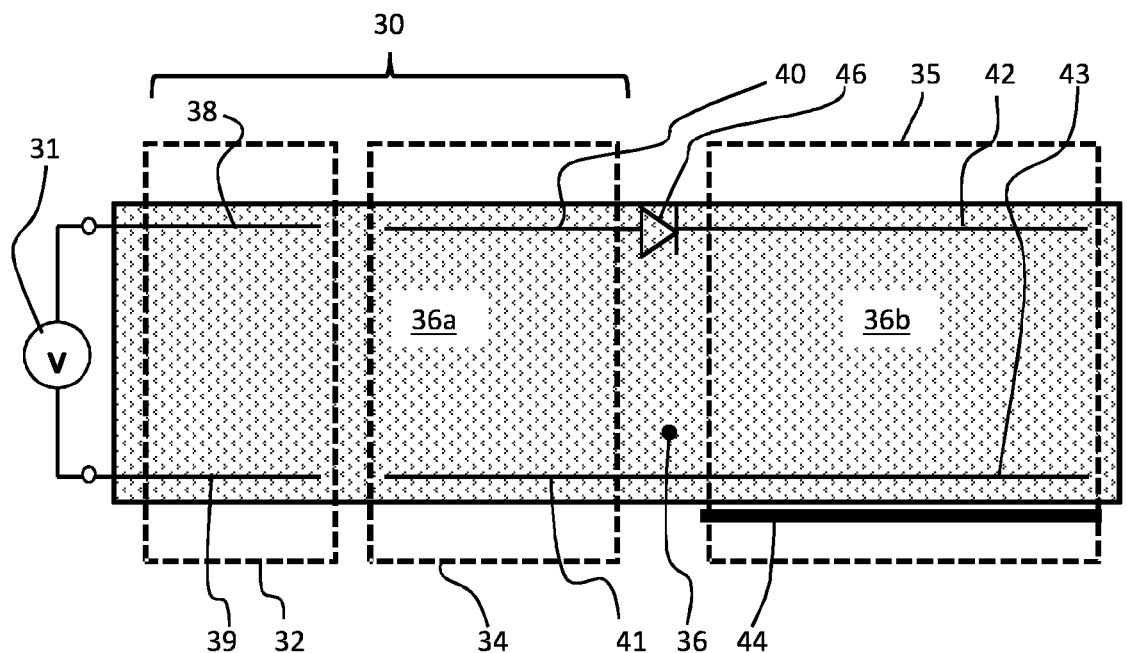
FIG. 3 shows a first example of an integrated EAP actuator and transformer.

FIG. 3 shows a first example of an actuator device. The device is shown in cross section in a vertical plane. It comprises a single integrated device which combines a piezoelectric transformer 30, having a primary side 32 and a secondary side 34, with an electroactive polymer actuator 35.

An AC voltage source 31 is at the input to the transformer.

Both the operation frequency and the conversion ratio of the transformer depend on the transformer design and can be tuned. Typical values for a commercially available piezoelectric transformer are a frequency of 85 kHz and conversion ratio of 50.

Generally, the frequency may be in the range of a few kHz up to a few hundred kHz, for example 10 kHz to 100 kHz. The voltage transformation ratio is for example in the range of 1 (only providing isolation and impedance transformation) to 1000, for example in the range 10 to 100.

In the example shown, there is a single electroactive polymer layer 36 which comprises a first portion 36a which extends across the primary and secondary sides of the transformer 30, and a second portion 36b which extends across the actuator 35.

Each side of the transformer comprises a portion of the piezoelectric electroactive polymer layer 36 sandwiched between upper and lower electrodes. The primary side 32 has an upper electrode 38 and a lower electrode 39, and the secondary side 34 has an upper electrode 40 and a lower electrode 41. The electroactive polymer actuator 35 has an upper electrode 42 and a lower electrode 43.

The first portion 36a of the electroactive polymer layer thus forms part of the piezoelectric transformer and the second portion 36b of the electroactive polymer layer forms part of the electroactive polymer actuator 35.

A carrier layer 44 is shown at the EAP actuator 35, for controlling or constraining the movement of the EAP actuator 35. It may of course extend across the full device.

The piezoelectric transformer is thus implemented using the piezoelectric EAP layer 36. The EAP layer 36 needs to be piezoelectric at least on the secondary side 34 of the transformer to provide the required mechanical to electrical conversion. Thus, the example of FIG. 3 uses a single polymer material which is piezoelectric. By way of example, PVDF or PVDF-TrFE may be used, or other piezoelectric polymers.

An advantage of the use of an EAP material in the transformer, in addition to the integration with the actuator, is that the basic drawback of a ceramic piezoelectric transformer, which is its brittleness, is addressed. The possible uses are thus extended and the possible shapes are less limited (for example ceramic piezoelectric transformers are generally limited to rectangular bars and generally with a height of at least 2 mm). Thinner transformers may be fabricated but then they are even more brittle. The EAP-based transformer may instead be a flexible lightweight device, which can easily be designed to any arbitrary shape, such as a curved design. It may also have a height of only a few hundred micrometres.

The desired dimensions (in plan view) will depend on several parameter and design implementations, such as the material properties and the number of layers. Very important is also the power/energy transfer capability, which correlates to the rate of charge-transfer (in combination with the voltage). This again relates to the chosen material properties and volume. The height (i.e. thickness) of the component as well as the width and length is also important.

EAPs are low power components, and accordingly the energy transfer is intrinsically low. For example, a standard EAP operated by a steep rectangular on-pulse of 200 V requires a peak power of about only 230 mW. After full activation to steady state operation, the required power is in the low mW regime (to compensate for intrinsic losses).

An indication of a suitable size range may be obtained based on the required performance. For example, to reach a delivered peak power an energy of 2.1 mWs needs to be pushed into the EAP (for example over a time period of around 20 ms). Linearizing this energy yields an average energy of ½*2.1 mWs=1.05 mWs which needs to be delivered by the transformer.

Based on the reference 'Biomedical Applications of EAPs'; F. Carpi, E. Smelal; Wiley; p. 327, the energy density of P(VDF-TrFE-CFE), which is be a suitable candidate for a transformer material, is known to be 1.22 Ws/cm$^3$. For comparison, the energy density of standard ceramic PZT is only 0.1 Ws/cm$^3$.

Thus, in this example, a volume of 1.05 mWs*1 cm$^3$/1.22 Ws=0.0009 cm$^3$ is required, i.e. approximately 1 mm$^3$.

For the lateral dimensions, of one winding part of the transformer may occupy 10 mm×10 mm. This yields a height in the range of 10 µm (excluding electrodes). Thus the whole transformer (both primary and secondary sides) has dimensions of the order of 20 mm×10 mm×0.01 mm.

This is simply an illustration to show that the required transformer size is in the range of the size of the active part of the EAP actuator (even when taking a low thickness of 10 µm) and hence does not increase the height of such an actuator.

It is desirable that the actuation function does not influence the operation of the transformer, for example the transformation ratio. The movement of the EAP actuator should therefore be isolated from the transformer. This may be ensured by defining a mechanically non-active part of the EAP layer 36 between the transformer and the EAP actuator, for example by having an area without any covering material layer, whereas such a covering layer (with different mechanical expansion coefficients) is used in the EAP actuator. This is shown in FIG. 3, where the carrier layer 44 is only used in the EAP actuator 35. However, the mechanical deformation caused by the actuation typically provides a reduced layer thickness, which in turn (beneficially) increases the voltage transformation ratio of the EAP-based transformer.

These issues can be taken into account in the design of the overall device.

An additional layer may also be provided on one or both sides of the device to improve the mechanical coupling between primary and secondary sides of the transformer. An additional stiffer layer or layers may be used to provide a preferred direction of the mechanical deformation.

To reduce the additional damping of the transformer function, caused by this stiffer layer, the inner sides at the interface between the additional stiffer layer and the transformer may be prepared to reduce friction, for example using low friction surfaces or a friction reducing fluid such as oil.

For the primary side of the transformer, a high deformation is desired with sufficient mechanical energy to transfer to the secondary side. For the secondary side, a high piezoelectric effect is desirable. There are several ways to improve the performance compared to a single uniform EAP layer across the transformer, such as a PVDF-relaxor polymer.

A first modification is to use controlled molecular orientation in the primary side and secondary side. A chosen molecular orientation will increase the electromechanical coupling (k). For example, the primary side may have a molecular orientation in the longitudinal (horizontal) direction, resulting in more mechanical energy being provided towards the secondary side. The secondary side may have a molecular orientation in the vertical direction. The higher coupling coefficient value will result in a greater amount of conversion to electrical energy.

A second modification is to use two different materials, one for the primary side and one for the secondary side. The primary side for example may use be a pre-strained dielectric elastomer (for example acrylics), having a high mechanical energy and a high coupling coefficient, or a PVDF-relaxor polymer. The design is chosen to optimize the conversion from electrical to mechanical energy.

The use of different materials may be combined with the selection of different molecular orientations.

The secondary side may then comprise a material which is brought into resonance by the primary side, based on a relatively high piezoelectric effect, for example a piezoelectric polymer (film), piezoelectric copolymer or a PVDF relaxor polymer with a low CFE/CTFE content. Ferroelectrets may be used in the secondary side for their high piezoelectric effect.

Figure 4:
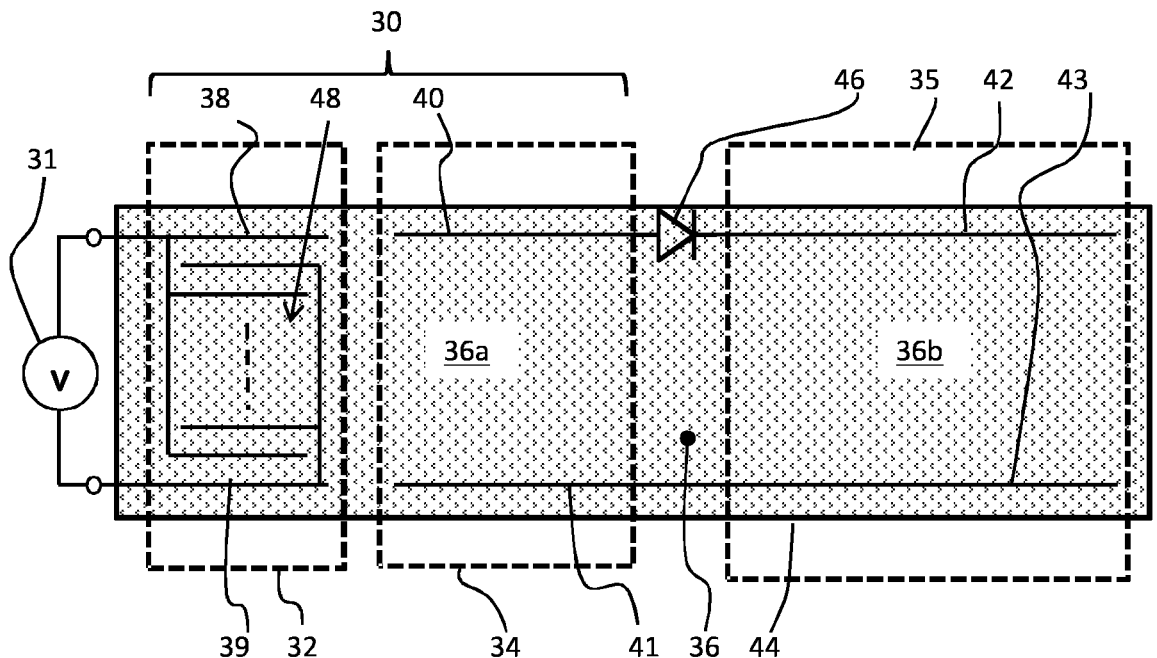
FIG. 4 shows a second example of an integrated EAP actuator and transformer.

The primary side 32 of the transformer 30 may use multilayer stack 48 as shown in FIG. 4, mechanically coupled to a single layer secondary side 34. The multilayer structure 46 at the primary side means than very high field strengths are applied to the inner layers, causing large mechanical deformations of both the primary and the mechanically coupled secondary side.

The multilayer stack 48 comprises thinner EAP layers, each provided between a pair of electrode layers, with the layers stacked with alternating polarity electrodes. Thus, only one pair of drive signals is needed, and interleave layered comb electrodes provide driving of the multiple layers. The deformation at the secondary side results in the generation of an even higher electrical field strength across the output terminals of the device and accordingly a correlated electrical voltage.

The transformer 30 does not require any stiff layers and can be kept fully flexible. A low voltage is applied to the primary side of the transformer which is then up-converted and supplied to the active EAP actuator 35. This setup is especially efficient for miniature actuators.

If a dc operating voltage is required (instead of a pulsewise operation mode), a rectifying diode may be added between the secondary side of the transformer and EAP actuator.

FIG. 4 (and also FIG. 3) also shows the secondary side output rectified by a simple diode 46 which connects between the electrode 40 of the secondary side and the electrode 42 of the EAP actuator. In addition to the rectifying function, the diode provides protection of the actuator against unwanted high voltage amplitudes with the opposite polarity to the desired drive polarity. A discharging terminal may then be added to the EAP actuator (not shown).

There are different possible operation modes of the actuator, and the diode may be needed for some and not for others.

In a pulsed operation mode of the actuator, the actuator may be used to generate short (non-static) mechanical deflections. In this case the diode is not needed between the secondary side of the transformer and the actuator. High frequency pulses may be used to maintain the mechanical deflection, although this can introduce losses and result in heating and temperature drift.

In a steady state mode of operation of the actuator, the actuator may be mechanically deflected and required to maintain its state for a period. If only a single pulse is applied, the mechanical deflection will change over time. In this case, a DC driving voltage is used and the diode is employed. The transformer section works only with a non-DC (sinusoidal or pulsed waveform) input. Thus, the non-DC voltage at the secondary side is rectified by the diode. The self-capacitance of the actuator will also smooth the signal.

In order to increase the mechanical deformation of the EAP actuator 35, a multilayer technique may also be used within the EAP actuator 35, as has been explained in connection with the primary side 32 of the transformer. This increases the electric field strength and thus causes greater deflections.

The transformer may be (partly) polarized to improve the voltage transformation performance. Any polycrystalline ceramic is composed of a multitude of randomly oriented crystals (dipoles) and the bulk properties are the sum of the properties of these crystallites. In the manufacturing of piezoelectric ceramics, a suitable ferroelectric material is first fabricated into a desired shape and electrodes are applied. The piezoelectric element is then heated to the Curie temperature: the temperature above which the spontaneous polarization and piezoelectric effect cease to exist. The heating is performed in the presence of a strong DC field. This polarizes the ceramic (i.e. aligns the molecular dipoles of the ceramic in the direction of an applied field). The polarization field remains frozen in place when the temperature is reduced below the Curie point and the field is removed. The greater the number of domains aligned, the greater the piezoelectric effect.

By poling the primary and secondary side accordingly (wherein the ideal direction of the dipoles depends on the chosen transformer principle) of a piezoelectric transformer the efficiency can be increased very well.

The mechanical coupling between the transformer and the EAP actuator by the shared EAP layer means that the actuation can affect the transformer function, as mentioned above.

Figure 5:
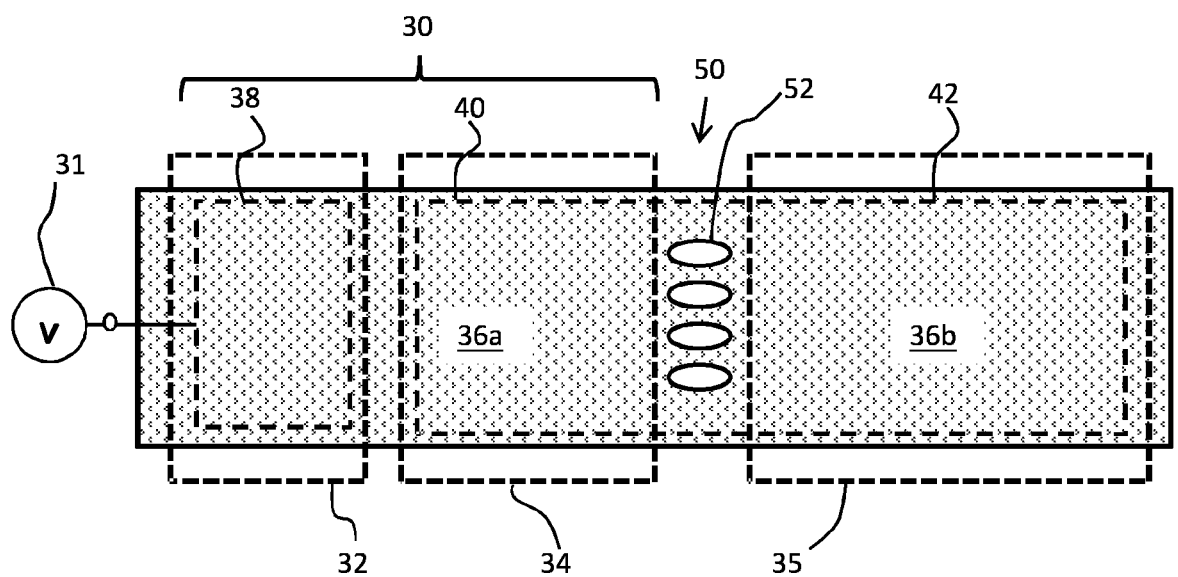
FIG. 5 shows a third example of an integrated EAP actuator and transformer.

FIG. 5 shows one approach for reducing the mechanical coupling between the transformer 30 and the EAP actuator 35. It shows a top view (with no diode). The connection between the secondary side 34 of the transformer and the EAP actuator area includes an isolation region 50. In the example shown, the isolation region comprises a set of vertical openings 52 which reduce the mechanical damping effect by the EAP actuator on the transformer. The openings do not need to be vertical. Indeed, any weakening structure may be used to provide an isolation function.

Instead of using openings for the isolation region 50, the secondary side of the transformer and the EAP actuator may be connected by an additional interface in the form of a soft material, for reducing the mechanical coupling. This material may for example fill even larger openings in the EAP layer.

The greatest decoupling may be achieved by separating the EAP layer into two separate portions, connected by the electrode wires or layers, and assembled on a sub carrier (for example a flexible PCB or foil). In this case, the EAP layer is discontinuous, but it is still formed as parts of a common overall layer. In other words, the same type of EAP layer 36 is formed for the transformer (secondary side) and the actuator.

One advantage of using EAPs as the transformer material is for integration of the transformer and actuator functions as described above. To optimize the transformer performance, the ratio of the thickness to the length (or width) of the transformer must not be too low. If it is too low the efficiency and voltage gain of the transformer will decrease significantly. An advantage of EAP materials is that they can be processed, for instance by printing methods or film drawing, into very thin layers, typically thinner than ceramic materials. This has two advantages.

First, the number of internal layers of the primary side can be increased for a given thickness of the secondary part, increasing the voltage gain.

Second, the total thickness of the device can be decreased. This second advantage enabled miniaturization of the transformer as described above. However, the ratio of the thickness to the length (or width) of the transformer must remain high enough. This can be achieved by dividing the transformer into an array of transformer elements by patterning the electrodes into an array of Rosen type transformers.

FIG. 6A shows two transformer elements 60a, 60b in parallel. The voltage source 31 connects to the inputs of both transformer elements in parallel, and they both connect to the output 62a, 62b in parallel. A parallel connection provides a higher current transformer design.

FIG. 6B shows two transformer elements 60a, 60b in series, wherein the output of the first transformer element 60a forms the input of the second transformer element 60b, and the output of the second transformer element 60b connects to the transformer output 62a, 62b. A series connection provides a higher voltage ratio transformer design.

FIG. 6C shows a combination of series and parallel connections, with two parallel elements 60a, 60b and two series elements 60c, 60d.

The integrated device described above enables the required input voltage to the device to be reduced, improving the safety of the component and improving electromagnetic performance. The device may be extremely flat and flexible without requiring any high voltage connections. In addition, lower drive frequencies may be used reducing losses in the driving electronics in comparison to ceramic piezoelectric transformers. The transformer also introduces a galvanic isolation between the EAP actuator and the power supply.

Materials suitable for the EAP layer are known.

The primary side of the transformer may use any material having the desired electrical to mechanical conversion function. The material for the secondary side is a piezoelectric material to provide the required mechanical to electrical conversion.

Electro-active polymers include, but are not limited to, the sub-classes: piezoelectric polymers, electromechanical polymers, relaxor ferroelectric polymers, electrostrictive polymers, dielectric elastomers, liquid crystal elastomers, conjugated polymers, Ionic Polymer Metal Composites, ionic gels and polymer gels.

The sub-class electrostrictive polymers includes, but is not limited to:

Polyvinylidene fluoride (PVDF), Polyvinylidene fluoride-trifluoroethylene (PVDF-TrFE), Polyvinylidene fluoride-trifluoroethylene-chlorofluoroethylene (PVDF-TrFE-CFE), Polyvinylidene fluoride-trifluoroethylene-chlorotrifluoroethylene) (PVDF-TrFE-CTFE), Polyvinylidene fluoride-hexafluoropropylene (PVDF-HFP), polyurethanes or blends thereof.

The sub-class dielectric elastomers includes, but is not limited to:

acrylates, polyurethanes, silicones.

The sub-class conjugated polymers includes, but is not limited to:

polypyrrole, poly-3,4-ethylenedioxythiophene, poly(p-phenylene sulfide), polyanilines.

Ionic devices may be based on ionic polymer-metal composites (IPMCs) or conjugated polymers. An ionic polymer-metal composite (IPMC) is a synthetic composite nanomaterial that displays artificial muscle behavior under an applied voltage or electric field.

In more detail, IPMCs are composed of an ionic polymer like Nafion or Flemion whose surfaces are chemically plated or physically coated with conductors such as platinum or gold, or carbon-based electrodes. Under an applied voltage, ion migration and redistribution due to the imposed voltage across a strip of IPMCs result in a bending deformation. The polymer is a solvent swollen ion-exchange polymer membrane. The field causes cations travel to cathode side together with water. This leads to reorganization of hydrophilic clusters and to polymer expansion. Strain in the cathode area leads to stress in rest of the polymer matrix resulting in bending towards the anode. Reversing the applied voltage inverts the bending.

If the plated electrodes are arranged in a non-symmetric configuration, the imposed voltage can induce all kinds of deformations such as twisting, rolling, torsioning, turning, and non-symmetric bending deformation.

In all of these examples, additional passive layers may be provided for influencing the electrical and/or mechanical behavior of the EAP layer in response to an applied electric field.

The EAP layer of each unit may be sandwiched between electrodes. The electrodes may be stretchable so that they follow the deformation of the EAP material layer. Materials suitable for the electrodes are also known, and may for example be selected from the group consisting of thin metal films, such as gold, copper, or aluminum or organic conductors such as carbon black, carbon nanotubes, graphene, poly-aniline (PANI), poly(3,4-ethylenedioxythiophene) (PEDOT), e.g. poly(3,4-ethylenedioxythiophene) poly(styrenesulfonate) (PEDOT:PSS). Metalized polyester films may also be used, such as metalized polyethylene terephthalate (PET), for example using an aluminum coating.

The invention can be applied in many EAP and photoactive polymer applications, including examples where a passive matrix array of actuators is of interest.

In many applications the main function of the product relies on the (local) manipulation of human tissue, or the actuation of tissue contacting interfaces. In such applications EAP actuators for example provide unique benefits mainly because of the small form factor, the flexibility and the high energy density. Hence EAP's and photoresponsive polymers can be easily integrated in soft, 3D-shaped and/or miniature products and interfaces. Examples of such applications are:

Skin cosmetic treatments such as skin actuation devices in the form of a responsive polymer based skin patches which apply a constant or cyclic stretch to the skin in order to tension the skin or to reduce wrinkles;

Respiratory devices with a patient interface mask which has a responsive polymer based active cushion or seal, to provide an alternating normal pressure to the skin which reduces or prevents facial red marks;

Electric shavers with an adaptive shaving head. The height of the skin contacting surfaces can be adjusted using responsive polymer actuators in order to influence the balance between closeness and irritation;

Oral cleaning devices such as an air floss with a dynamic nozzle actuator to improve the reach of the spray, especially in the spaces between the teeth. Alternatively, toothbrushes may be provided with activated tufts;

Consumer electronics devices or touch panels which provide local haptic feedback via an array of responsive polymer transducers which is integrated in or near the user interface;

Catheters with a steerable tip to enable easy navigation in tortuous blood vessels;

Measurements of physiological human body parameters such as heart beat, SpO2 and blood pressure.

Another category of relevant application which benefits from such actuators relates to the modification of light. Optical elements such as lenses, reflective surfaces, gratings etc. can be made adaptive by shape or position adaptation using these actuators. Here one benefit of EAPs for example is a lower power consumption.

The examples above are based on a transversal-mode operating transformer, with electrical isolation between the primary side and the secondary side. However, other vibration mode based transformers are possible as well. Internal electrodes may also be added to the secondary side. The primary side may use a single layer or a multilayer structure. The primary and secondary sides may be referenced to a common potential.

One aspect of the invention relates to the use of a diode with the device. There are other aspects which do not require this feature.

The general common features of the invention are an actuator device comprising:

an electroactive polymer actuator (35); and a piezoelectric transformer (30) having a primary side (32) and a secondary side (34), wherein the actuator device comprises a piezoelectric electroactive polymer layer (36) comprising a first portion (36a) and a second portion (36b), wherein the first portion (36a) of the electroactive polymer layer forms part of the secondary side (34) of the piezoelectric transformer and the second portion (36b) of the electroactive polymer layer forms part of the electroactive polymer actuator (35).

The diode arrangement (46) is electrically connected between the secondary side (34) of the piezoelectric transformer and the electroactive polymer actuator (35) is one aspect.

A second aspect is forming the primary side (32) and secondary side (34) of the piezoelectric transformer from different electroactive polymer materials.

A third aspect is that the transformer elements are electrically connected in parallel, with their inputs in parallel and their outputs in parallel, or in series, or as a combination of parallel and series transformer elements.

These second and third aspects do not require the use of a diode.

Note that these other aspects may be combined with other features, such as the flexible design, the isolation region and the multistack design.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. An actuator device comprising:
   an electroactive polymer actuator;
   a piezoelectric transformer, wherein the piezoelectric transformer has a primary side and a secondary side;
   a piezoelectric electroactive polymer layer, wherein the piezoelectric electroactive polymer layer comprises a first portion and a second portion; and
   a diode arrangement,
   wherein the first portion of the piezoelectric electroactive polymer layer forms a portion of the secondary side and the second portion of the piezoelectric electroactive polymer layer forms a portion of the electroactive polymer actuator, and
   wherein the diode arrangement is electrically connected between the secondary side and the electroactive polymer actuator.

2. The actuator device as claimed in claim 1, wherein the primary side comprises a multilayer stack.

3. The actuator device as claimed in claim 1, further comprising an isolation region, wherein the isolation region is disposed in the piezoelectric electroactive polymer layer between the secondary side and the electroactive polymer actuator.

4. The actuator device as claimed in claim 3, wherein the isolation region comprises one or more openings in the piezoelectric electroactive polymer layer.

5. The actuator device as claimed in claim 1, wherein the piezoelectric transformer comprises a plurality of coplanar transformer elements.

6. The actuator device as claimed in claim 5, wherein the plurality of coplanar transformer elements are electrically connected in parallel, with their inputs in parallel and their outputs in parallel.

7. The actuator device as claimed in claim 1, wherein the piezoelectric transformer is flexible.

8. The actuator device as claimed in claim 1,
   wherein the primary side is formed from a first electroactive polymer material
   wherein the secondary side is formed from a second electroactive polymer material, and
   wherein the first electroactive polymer material is different from the second electroactive polymer material.

9. The actuator device as claimed in claim 8, wherein the first electroactive polymer material comprises a pre-strained dielectric elastomer.

10. The actuator device as claimed in claim 8,
    wherein the first electroactive polymer material has a first molecular orientation and the second electroactive polymer material has a second molecular orientation, and
    wherein the first molecular orientation is different from the second molecular orientation.

11. The device as claimed in claim 10, wherein the first molecular orientation is in a longitudinal direction extending between the piezoelectric transformer and the electroactive polymer actuator, and the second molecular orientation is perpendicular to the plane of the piezoelectric electroactive polymer layer.

12. The actuator device as claimed in claim 1, wherein the piezoelectric electroactive polymer layer is selected from a group consisting of polyvinylidene fluoride (PVDF) or polyvinylidene fluoride-trifluoroethylene (PVDF-TrFE).

13. A method of driving an electroactive polymer actuator, comprising:
    applying a drive signal to a piezoelectric transformer, wherein the piezoelectric transformer comprises a primary side and a secondary side;
    coupling the secondary side to the electroactive polymer actuator using a piezoelectric electroactive polymer layer, wherein a first portion of the piezoelectric electroactive polymer layer forms part of the secondary side and a second portion of the piezoelectric electroactive polymer layer forms part of the electroactive polymer actuator;
    coupling a diode arrangement between the secondary side and the electroactive polymer actuator; and
    driving the electroactive polymer actuator using an output from the piezoelectric transformer.

14. The method as claimed in claim 13, wherein the primary side comprises a multilayer stack.

15. The method as claimed in claim 13,
    wherein the electroactive polymer actuator comprises an isolation region, and
    wherein the isolation region is disposed in the piezoelectric electroactive polymer layer between the secondary side and the electroactive polymer actuator.

16. The method as claimed in claim 13,
    wherein the primary side is formed from a first electroactive polymer material,
    wherein the secondary side is formed from a second electroactive polymer material, and
    wherein the first electroactive polymer material is different from the second electroactive polymer material.

17. The actuator device as claimed in claim 1, wherein the electroactive polymer actuator comprises a multilayer stack.

18. The actuator device as claimed in claim 3,
    wherein the isolation region comprises an additional interface material, and
    wherein the additional interface material comprises one or more openings.

19. The actuator device as claimed in claim 5, wherein the plurality of coplanar transformer elements are electrically connected in series.

20. The actuator device as claimed in claim 5, wherein the plurality of coplanar transformer elements are electrically connected in a combination of parallel and series transformer elements.

* * * * *